United States Patent
Huang et al.

(10) Patent No.: US 9,229,269 B2
(45) Date of Patent: Jan. 5, 2016

(54) DISPLAY APPARATUS AND DISPLAY METHOD

(71) Applicant: HTC Corporation, Taoyuan County (TW)

(72) Inventors: Hsiao-Chuan Huang, Taoyuan County (TW); Tsung-Hwa Yang, Taoyuan County (TW); Chih-Jen Hu, Taoyuan County (TW)

(73) Assignee: HTC Corporation, Taoyuan (TW)

( * ) Notice: Subject to any disclaimer, the term of this patent is extended or adjusted under 35 U.S.C. 154(b) by 282 days.

(21) Appl. No.: 13/761,153

(22) Filed: Feb. 7, 2013

(65) Prior Publication Data

US 2013/0215365 A1    Aug. 22, 2013

Related U.S. Application Data

(60) Provisional application No. 61/601,572, filed on Feb. 22, 2012.

(51) Int. Cl.
*G02F 1/1335* (2006.01)
*H01L 27/32* (2006.01)

(52) U.S. Cl.
CPC ...... *G02F 1/133528* (2013.01); *H01L 27/3232* (2013.01); *G02F 2201/44* (2013.01); *H01L 2251/5323* (2013.01)

(58) Field of Classification Search
CPC .............. G02F 1/133528; G02F 2001/133541
USPC ........................................ 349/96, 98; 313/112
See application file for complete search history.

(56) References Cited

U.S. PATENT DOCUMENTS

| | | |
|---|---|---|
| 2003/0095228 A1 | 5/2003 | Hiji et al. |
| 2005/0122053 A1 | 6/2005 | Ko |
| 2006/0255706 A1 | 11/2006 | Mitsui et al. |

(Continued)

FOREIGN PATENT DOCUMENTS

| | | |
|---|---|---|
| CN | 1866104 | 11/2006 |
| TW | 388023 | 4/2000 |

(Continued)

OTHER PUBLICATIONS

"Search Report of European Counterpart Application", issued on Oct. 11, 2013, p. 1-p. 8.

(Continued)

*Primary Examiner* — Thanh-Nhan P Nguyen
(74) *Attorney, Agent, or Firm* — Jianq Chyun IP Office

(57) ABSTRACT

A display apparatus switchable between a first mode and a second mode is provided. The display apparatus includes a transparent light emitting layer, a light modification layer and a first polarization layer. The transparent light emitting layer is configured to display image in the first mode and be disabled in the second mode. The light modification layer is disposed under the transparent light emitting layer. The first polarization layer between the transparent light emitting layer and the light modification layer is configured to polarize an incident light which transmits through the transparent light emitting layer. When the display apparatus is operated in the first mode, the light modification layer is configured to absorb the incident light, and when the display apparatus is operated in the second mode, the light modification layer is configured to reflect the incident light. Another display apparatus and a display method are also provided.

21 Claims, 11 Drawing Sheets

(56) References Cited

U.S. PATENT DOCUMENTS

| | | |
|---|---|---|
| 2007/0194702 A1 | 8/2007 | Jeng et al. |
| 2010/0033451 A1 | 2/2010 | Shinn et al. |
| 2010/0033798 A1 | 2/2010 | Wang et al. |
| 2011/0050545 A1 | 3/2011 | Namm et al. |
| 2011/0267279 A1* | 11/2011 | Alvarez Rivera et al. .... 345/173 |

FOREIGN PATENT DOCUMENTS

| | | |
|---|---|---|
| TW | 201120475 | 6/2011 |
| TW | 201207540 | 2/2012 |
| WO | 2011025611 | 3/2011 |
| WO | 2011058725 | 5/2011 |

OTHER PUBLICATIONS

"Office Action of China Counterpart Application", issued on Feb. 25, 2015, p. 1-p. 12.

"Office Action of Taiwan Counterpart Application," issued on Sep. 14, 2015, p1-p6, in which the listed references were cited.

* cited by examiner

DISPLAY APPARATUS AND DISPLAY METHOD

CROSS-REFERENCE TO RELATED APPLICATION

This application claims the priority benefits of U.S. provisional application Ser. No. 61/601,572, filed on Feb. 22, 2012. The entirety of the above-mentioned patent applications is hereby incorporated by reference herein and made a part of this specification.

BACKGROUND

1. Field of the Disclosure

The disclosure generally relates to a display apparatus and a display method thereof, and more particularly, to a display apparatus switchable between different modes and a display method thereof.

2. Description of Related Art

Information and communication technology (ICT) industry has become today's mainstream industry, and since the display serves as a communication interface between man and information, development of the display is very important. The display industry has been developed in response to demands for small size, light weight as well as high resolution. According to those demands, organic electroluminescent devices are attracting attention as the most practical technology.

A transparent organic light emitting diode (TOLED) display is characterized by self-luminance, wide view angle, fast response speed, low operation voltage, low temperature operation, high photo-voltaic efficiency, and so on. In general, the TOLED display has a stack structure composed of a TOLED layer and a transparent thin film transistor (TFT) layer. The TOLED layer is controlled by the transparent TFT layer on light emitting.

The conventional TOLED display may show its backside simultaneously, and such a characteristic may be considered as an advantage of the conventional TOLED display. However, such a characteristic may sometimes decrease visibility or serve as a disturbance because the background can be seen.

SUMMARY OF THE DISCLOSURE

Accordingly, the disclosure is directed to a display apparatus switchable between a first mode and a second mode, and that a background pattern provided by the display apparatus can be shown through the display apparatus when a transparent light emitting layer for displaying images is disabled in the second mode. Further, the disclosure is also directed to a display method switching the display apparatus between the first mode and the second mode.

The disclosure provides a display apparatus, which is switchable between a first mode and a second mode. The display apparatus includes a transparent light emitting layer, a light modification layer and a first polarization layer. The transparent light emitting layer is configured to display images in the first mode and be disabled in the second mode. The light modification layer is disposed at a first side of the transparent light emitting layer which is under the transparent light emitting layer and including a first substrate, a second substrate under and opposed to the first substrate, a plurality of electrodes disposed on the second substrate, a liquid crystal layer disposed between the first substrate and the second substrate and a reflective layer disposed under the liquid crystal layer. The first polarization layer is disposed between the transparent light emitting layer and the light modification layer and configured to polarize an incident light which transmits through the transparent light emitting layer. When the display apparatus is operated in the first mode, the light modification layer is configured to absorb the incident light by the liquid crystal layer, and when the display apparatus is operated in the second mode, the light modification layer is configured to reflect the incident light by the reflective layer so that the incident light is reflected as a reflected light transmitting through the transparent light emitting layer.

The disclosure provides another display apparatus, which is also switchable between a first mode and a second mode. The display apparatus includes a transparent light emitting layer and a light modification layer. The transparent light emitting layer is configured to display images in the first mode and be disabled in the second mode. The light modification layer is disposed at a first side of the transparent light emitting layer which is under the transparent light emitting layer and including a first substrate, a second substrate under and opposed to the first substrate and a plurality of pixel units disposed between the first substrate and the second substrate, where each pixel unit includes an electrode and a color medium. When the display apparatus is operated in the first mode, the light modification layer is configured to absorb an incident light, which transmits through the transparent light emitting layer, by the color medium. When the display apparatus is operated in the second mode, the light modification layer is configured to reflect the incident light so that the incident light is reflected as a reflected light transmitting through the transparent light emitting layer.

The disclosure provides a display method adopted by a display apparatus. The display apparatus includes a transparent light emitting layer and a light modification layer disposed under the transparent light emitting layer. The transparent light emitting layer is configured to display images in a first mode and be disabled in a second mode. The display method includes following steps. When the transparent light emitting layer is operated in the first mode, the light modification layer is configured to absorb an incident light from the transparent light emitting layer. When the transparent light emitting layer is disabled in the second mode, the light modification layer is configured to reflect the incident light from the transparent light emitting layer, so that the incident light is reflected as a reflected light transmitting through the transparent light emitting layer.

As described above, in a display apparatus provided by the disclosure, the light modification layer is configured to absorb or to reflect the incident light. When the transparent light emitting layer is enabled and displaying images, the light modification layer is configured to absorb the incident light transmitting through the transparent light emitting layer, so that the light modification layer is employed as a solid black background. On the other hand, when the transparent light emitting layer is disabled, the light modification layer is configured to reflect the incident light, and the incident light is reflected as a reflected light transmitting through the transparent light emitting layer. Since the reflective layer, a color filter or a color medium may be disposed in the light modification layer, the desired color or visual pattern can be shown through the display apparatus.

Additionally, in a display method provided by the present disclosure, the light modification layer is configured depending on the operation mode of the display apparatus. When the display apparatus is operated in the first mode for displaying images, the light modification layer is configured to absorb the incident light. By contrast, when the display apparatus is operated in the second mode and the transparent light emitting layer is disabled, the light modification layer is configured to reflect the incident light.

These and other exemplary embodiments, features, aspects, and advantages of the disclosure will be described and become more apparent from the detailed description of exemplary embodiments when read in conjunction with accompanying drawings.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
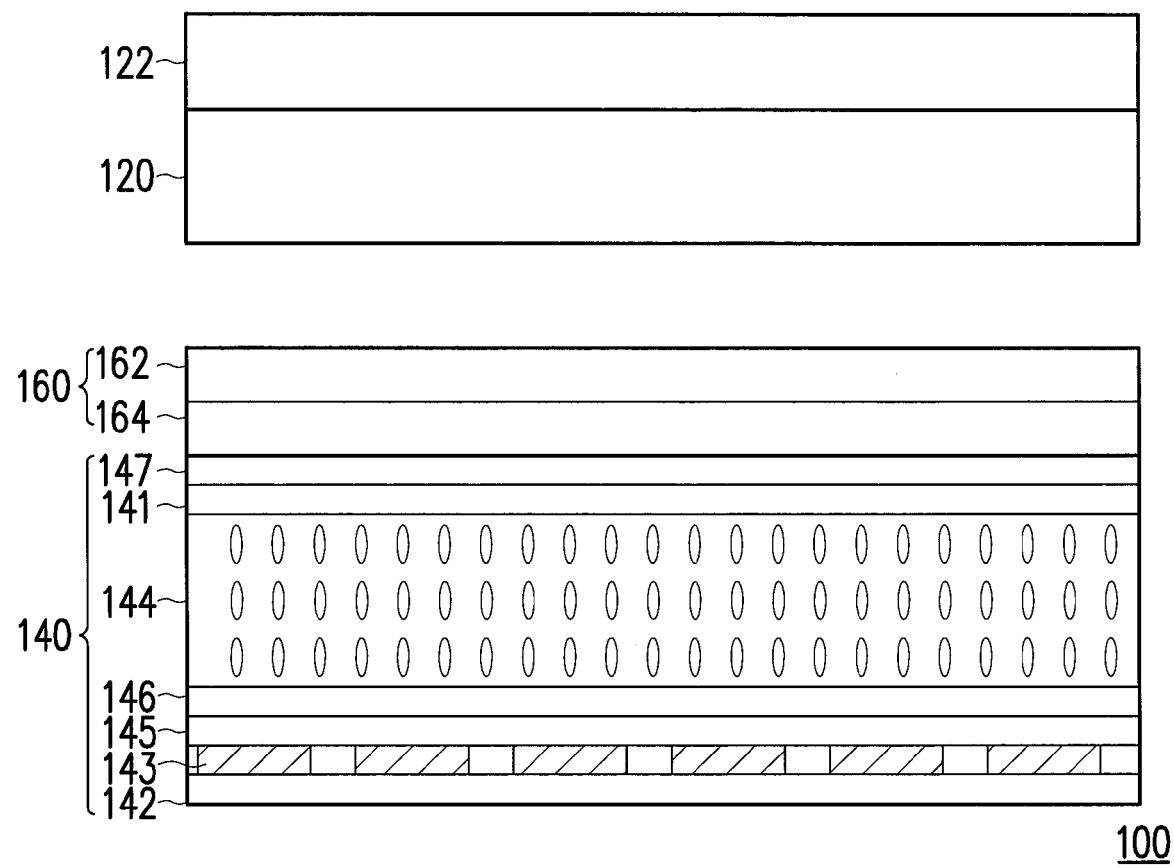
FIG. 1A is a schematic diagram illustrating a display apparatus according to an embodiment of the present disclosure.

Reference will now be made in detail to the present preferred embodiments of the disclosure, examples of which are illustrated in the accompanying drawings. Wherever possible, the same reference numbers are used in the drawings and the description to refer to the same or like parts.

Certain embodiments disclosed herein are set forth below. These aspects are presented merely to provide the reader with a brief summary of these certain embodiments, and that these aspects are not intended to limit the scope of this disclosure. Indeed, this disclosure may include a variety of aspects that may not list below.

FIG. 1A is a schematic diagram illustrating a display apparatus according to an embodiment of the present disclosure. Referring to FIG. 1A, the display apparatus 100 which is switchable between a first mode and a second mode includes a transparent light emitting layer 120, a light modification layer 140 and a first polarization layer 160. The transparent light emitting layer 120 is configured to display images in the first mode and be disabled in the second mode. To be more specific, the transparent light emitting layer 120 may include, for example but not limited to, an OLED layer and a transparent TFT layer for light emitting.

The light modification layer 140 is disposed at a first side of the transparent light emitting layer 120 which is under the transparent light emitting layer 120 and including a first substrate 141, a second substrate 142 under and opposed to the first substrate 141, a plurality of electrodes 143 disposed on the second substrate 142, a liquid crystal layer 144 disposed between the first substrate 141 and the second substrate 142 and a reflective layer 145 disposed under the liquid crystal layer 144. The first polarization layer 160 is disposed between the transparent light emitting layer 120 and the light modification layer 140. In addition, the first polarization layer 160 is configured to polarize an incident light which transmits through the transparent light emitting layer 120.

The brief structure of the display apparatus 100 is described in the above description, but additional layers can be added to assist on switching the display apparatus 100 between different modes and displaying images.

In this embodiment, the light modification layer 140 further includes a color filter layer 146 and a first quarter waveplate 147. The reflective layer 145 is disposed on the electrodes 143, and the color filter layer 146 is disposed between the liquid crystal layer 144 and the reflective layer 145. The color filter layer 146 may include various coloring layer stacking up to form a color matrix to display in various colors. Further, a printed pattern such as a logo or a figure may be printed on the color filter layer 146 or the reflective layer 145. The first quarter waveplate 147 is disposed between the first polarization layer 160 and the first substrate 141. Moreover, the first polarization layer 160 includes a second quarter waveplate 162 and a first linear polarizer 164, where the first linear polarizer 164 is disposed between the second quarter waveplate 162 and the first substrate 141. The display apparatus 100 further includes a circular polarizer 122 at a second side of the transparent light emitting layer 120, where the second side of the transparent light emitting layer 120 is opposite to the first side of the transparent light emitting layer 120.

The display apparatus 100 described above can be operated in different modes. When the display apparatus 100 is operated in the first mode for displaying images, the light modification layer 140 is configured to absorb the incident light transmitting through the transparent light emitting layer 120 by the liquid crystal layer 144, and when the display apparatus 100 is operated in the second mode and disabled, the light modification layer 140 is configured to reflect the incident light by the reflective layer 145 so that the incident light is reflected as a reflected light transmitting through the transparent light emitting layer 120. In other words, the light modification layer 140 is adjusted depending on the operation state of the display apparatus 100. The incident light is blocked or absorbed in the first mode, so as to provide a solid black background. By contrast, the incident light is reflected by the reflective layer 145 and transmitting through the transparent light emitting layer 120 in the second mode to show the printed pattern or color of the color filter layer 146. Detailed operation and operation principle of the display apparatus 100 are described below.

Figure 1B:
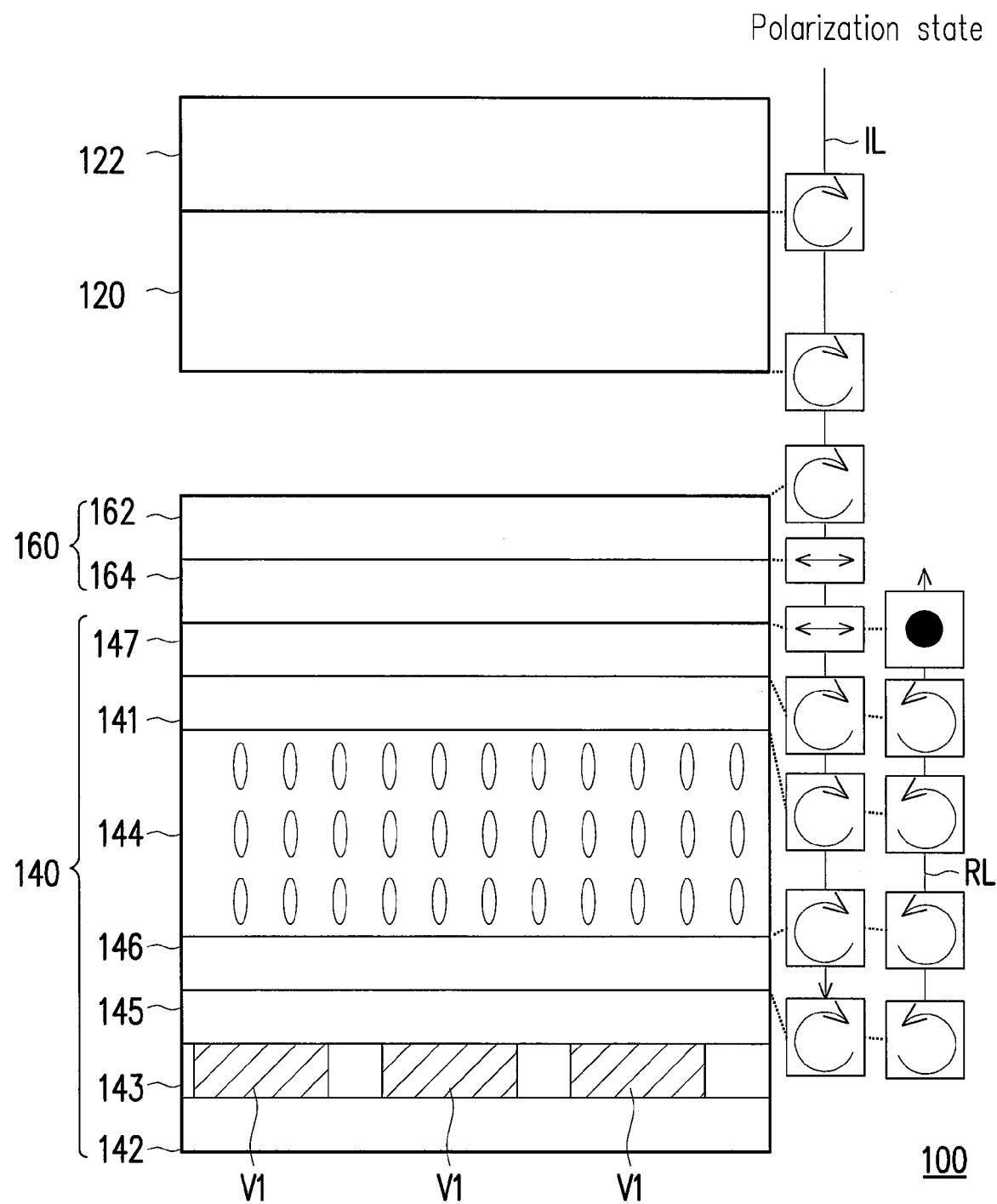
FIG. 1B is a schematic diagram illustrating a display apparatus operated in a first mode according to an embodiment of the present disclosure.

In the following description, the terms "right" and "left" should be viewed on the basis of the Right-Hand-Rule. In addition, the following schematic diagrams are the cross-sectional views of the display apparatus. Therefore, the term "vertical" should be viewed as a direction perpendicular to the cross-sections. Moreover, the term "horizontal" should be view as a direction parallel to the cross-sections. FIG. 1B is a schematic diagram illustrating a display apparatus 100 operated in the first mode according to the embodiment of the present disclosure. The changes of polarization states of the incident light IL and the reflected light RL are illustrated in coordinating with the structure of the display apparatus 100. Referring to FIG. 1B, the display apparatus 100 is active and displaying images. When an unpolarized incident light IL enters the display apparatus 100, the circular polarizer 122 firstly polarizes the incident light IL to a right circular polarized incident light IL. The right circular polarized light IL then goes through the transparent light emitting layer 120. Next, the right circular polarized incident light IL transmits through the first polarization layer 160. The second quarter waveplate 162 polarizes the right circular polarized incident light IL to be a horizontal linear polarized incident light IL, and the first linear polarizer 164 allows the horizontal linear polarized incident light IL to pass.

When the display apparatus 100 is operated in the first mode, a first voltage V1 is applied through at least one of the electrodes 143 to generate a first electric field, and the liquid crystal layer 144 is induced by the first electric field to transmit the incident light IL through the liquid crystal layer 144 without changing the polarization state of the incident light IL. Based on the previous description, when the horizontal linear polarized incident light IL transmits to the light modification layer 140, the first quarter waveplate 147 polarizes the horizontal linear polarized incident light IL back to the right circular polarized incident light IL. Then, the right circular polarized incident light IL transmits through the liquid crystal layer 144 and the color filter layer 146 and reaches to the reflective layer 145 so that the right circular polarized incident light IL is reflected as a left circular polarized reflected light RL.

The left circular reflected light RL is further transmitted back to the first polarization layer as a vertical linear polarized reflected light RL due to the polarization of the first quarter waveplate 147. However, the vertical linear polarized reflected light RL will be blocked by the first linear polarizer 164 in the first polarization layer 160 because of the difference of the polarization direction.

Figure 1C:
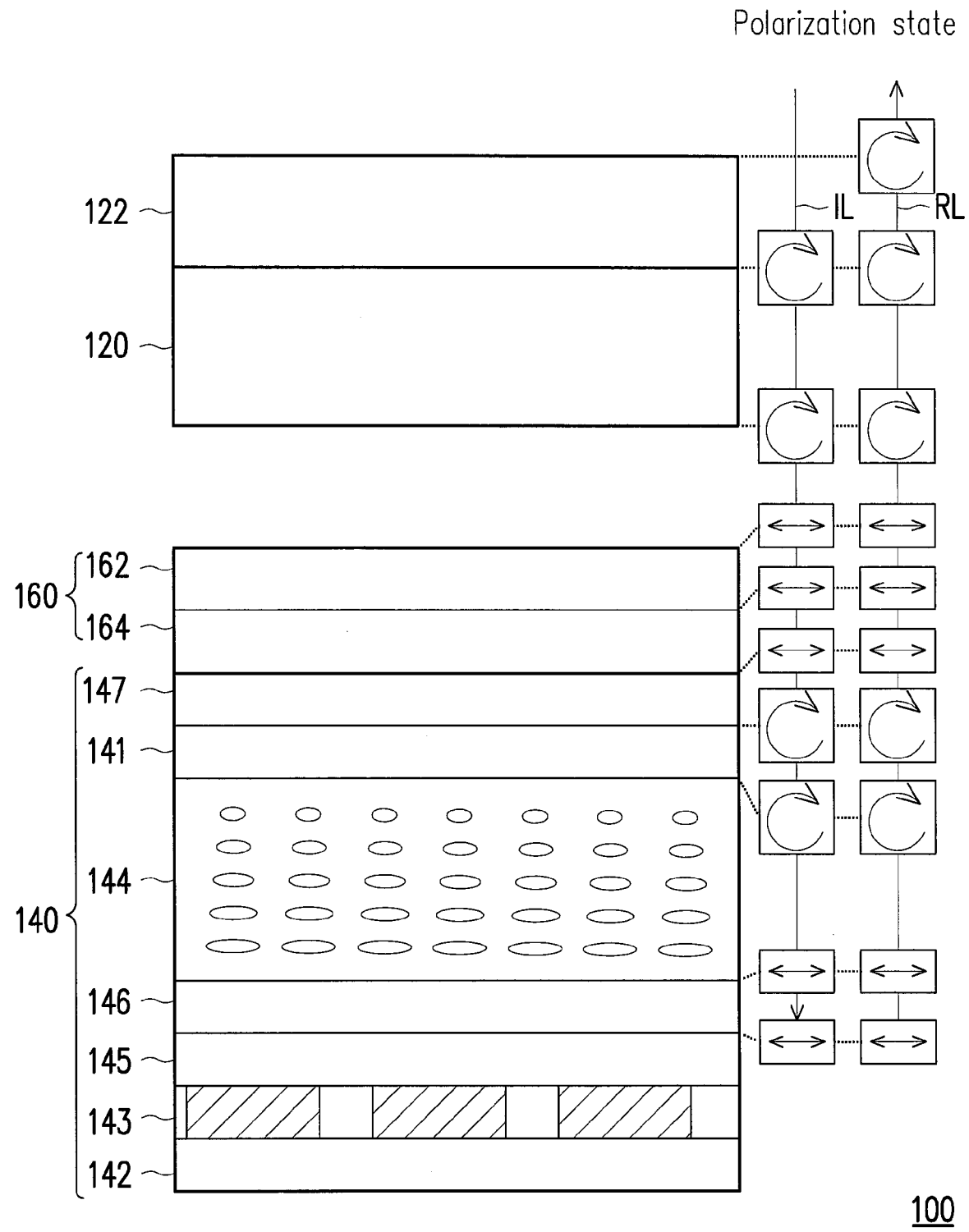
FIG. 1C is a schematic diagram illustrating a display apparatus operated in a second mode according to an embodiment of the present disclosure.

By contrast, when the display apparatus 100 is inactive and disabled, the light path of the incident light IL and the reflected light RL in the second mode is different form the light path of the incident light IL and the reflected light RL in the first mode. FIG. 1C is a schematic diagram illustrating a display apparatus 100 operated in the second mode according to the embodiment of the present disclosure. Referring to FIG. 1C, when the incident light IL transmits through the transparent light emitting layer 120 and the first polarization layer 160, the incident light IL is polarized to be the horizontal linear polarized incident light IL. Further, the first quarter waveplate 147 also polarizes the horizontal linear polarized incident light IL to the right circular polarized incident light IL. The difference is that, when the display apparatus 100 is operated in the second mode, no voltage is applied through at least one of the electrodes 143, and the polarization state of the right circular polarized incident light IL is changed by the liquid crystal layer 144 to be the horizontal linear polarized incident light IL again. After that, the horizontal linear polarized incident light IL is reflected by the reflective layer 145 as the reflected light RL which is also horizontal linear polarized.

As shown in the FIG. 1C, the horizontal linear polarized reflected light RL is thus reflected towards the transparent light emitting layer 120 and transferred by the liquid crystal layer 144 to be the right circular polarized reflected light RL. Next, the right circular polarized reflected light RL is then polarized by the first quarter waveplate 147 to the horizontal linear polarized reflected light RL again and leaves the light modification layer 140. Since the reflected light RL is horizontal linear polarized, the first linear polarizer 164 allows the reflected light RL to pass through it. Then, the second quarter waveplate 162 polarizes the horizontal linear polarized reflected light RL to the right circular polarized reflected light RL, and the reflected light RL leaves the display apparatus 100.

Figure 1D:
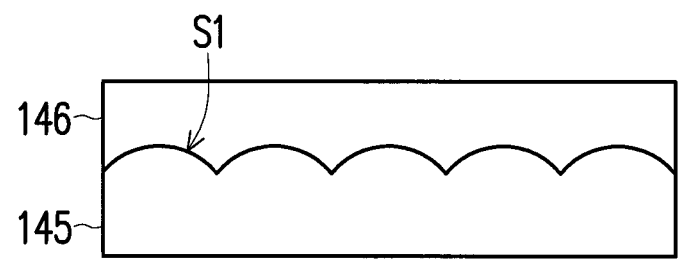
FIG. 1D is a schematic diagram illustrating a shape of the reflective layer according to the embodiment of the present disclosure.

The reflective layer 145 employed in the display apparatus 100 can be shaped to obtain better optical effect. FIG. 1D is a schematic diagram illustrating a shape of the reflective layer 145 according to the embodiment of the present disclosure. Referring to FIG. 1D, a surface S1 of the reflective layer 145 facing to the transparent light emitting layer 120 (shown in FIG. 1A) is bump-shaped. With the bump-shaped surface S1, when the incident light IL is reflected by the reflective layer 145, the incident light IL reflected by the bumps may be scattered to achieve a uniform light field.

Figure 1E:
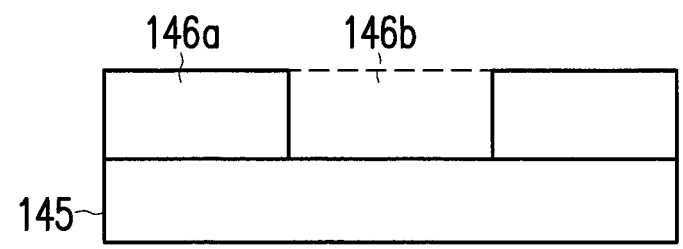
FIG. 1E is a schematic diagram illustrating a color filter layer according to an embodiment of the present disclosure.

In addition, the color filter layer 146 can be designed to have a different pattern as well. FIG. 1E is a schematic diagram illustrating a color filter layer 146 according to an embodiment of the present disclosure. Referring to FIG. 1E, the color filter layer 146 has a first portion 146a and a second portion 146b, where a first wavelength of the incident light and the reflected light is absorbed by the first portion 146a, but the incident light and the reflected light transmitting through the second portion 146b are free to the light absorption. For example, the reflective layer 145 in FIG. 1E is partially covered by the color filter layer 146, so the light absorption is only performed at the first portion 146a of the color filter layer 146 where the color filter layer 146 exists and covers the reflective layer 145.

According to the aforementioned descriptions, the light modification 140 is configured to absorb or to reflect the incident light IL depending on the operation mode of the display apparatus 100. Polarization effect of the display apparatus 100 shown in the previous description can be changed by selecting the combination of polarizers and waveplates. That is to say, the structure of the display apparatus 100 is variable and not limited to the previous embodiment.

Figure 2:
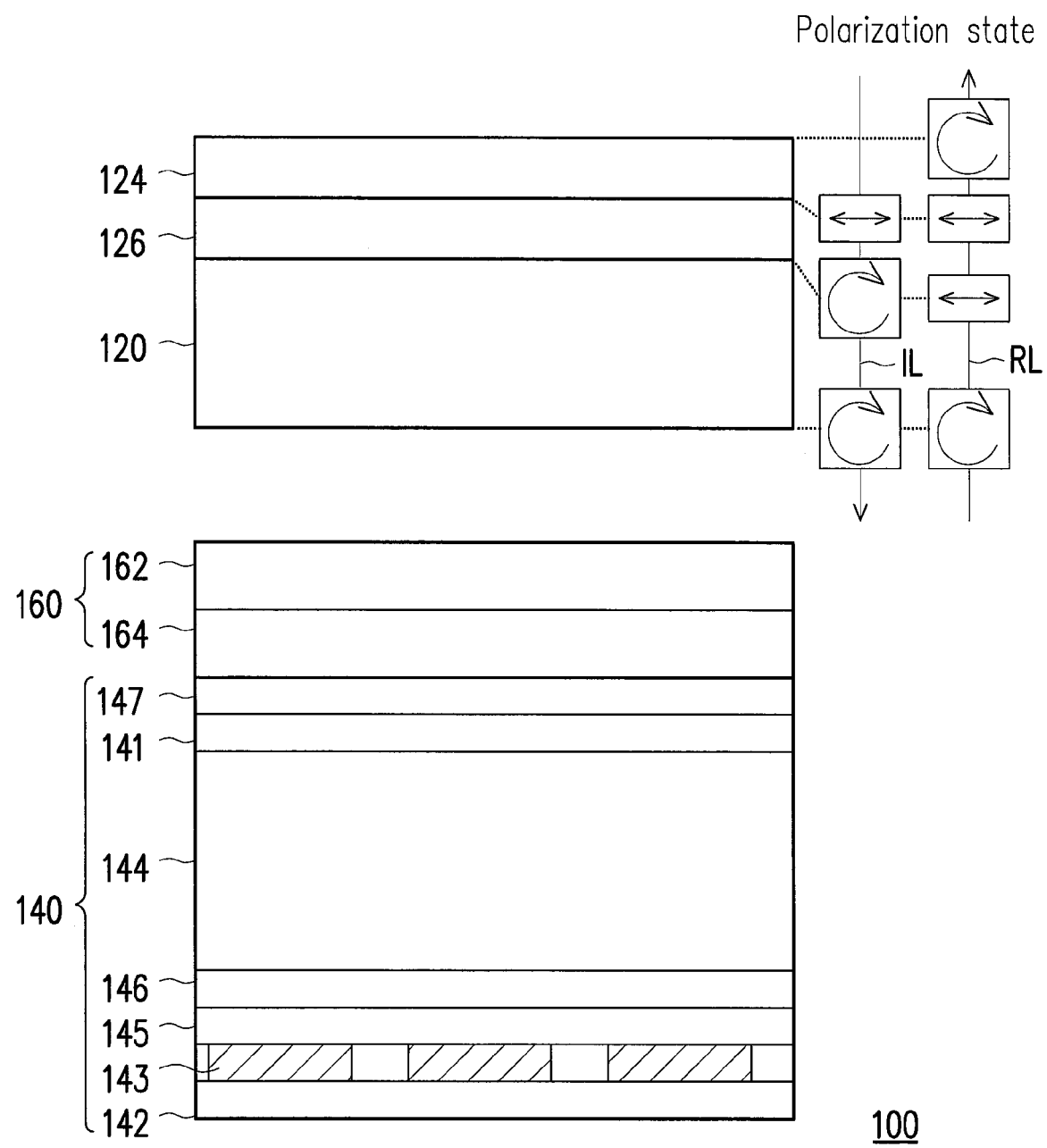
FIG. 2 is a schematic diagram illustrating a display apparatus according to another embodiment of the present disclosure.

FIG. 2 is a schematic diagram illustrating a display apparatus 100 according to another embodiment of the present disclosure. Referring to FIG. 2, a second linear polarizer 124 and a third quarter waveplate 126 are employed in the display apparatus 100 instead of the circular polarizer 122 shown in FIG. 1A-1C. The second linear polarizer 124 is disposed at the second side of the transparent light emitting layer 120 and a third quarter waveplate 126 is disposed between the second linear polarizer 124 and the transparent light emitting layer 120. When the incident light IL sequentially transmits through the second linear polarizer 124 and the third quarter waveplate 126, the unpolarized incident light IL is firstly polarized to the horizontal linear polarized incident light IL, and then the horizontal linear polarized incident light IL is polarized to be the right circular polarized incident light IL. Both the combination of the second linear polarizer 124 and the third quarter waveplate 126 shown in FIG. 2 and the circular polarizer 122 shown in FIG. 1B polarize the incident light IL to be the right circular polarized incident light IL. Since first polarization layer 160 and the light modification layer 140 shown in FIG. 2 and FIGS. 1A~1C are the same, the changes of the polarization state of the incident light IL and the reflected light RL in the first polarization layer 160 and the light modification layer 140 are similar in FIG. 2 and FIGS.

1A~1C. Therefore, the changes of the polarization state of the incident light IL and the reflected light RL in the first polarization layer 160 and the light modification layer 140 of FIG. 2 can be inferred from FIGS. 1A~1C. When the display apparatus 100 is in the second mode, the reflected light RL transmitting through the light modification layer 140 and the first polarization layer 160 is right circular polarized. When the right circular polarized reflected light RL sequentially transmits through the third quarter waveplate 126 and the second linear polarizer 124, the right circular polarized reflected light RL is polarized to be the horizontal linear polarized reflected light RL. Therefore, in FIG. 2, the reflected light RL leaving the display apparatus 100 is horizontal linear polarized, which is different from the reflected light RL shown in FIG. 1C.

Figure 3:
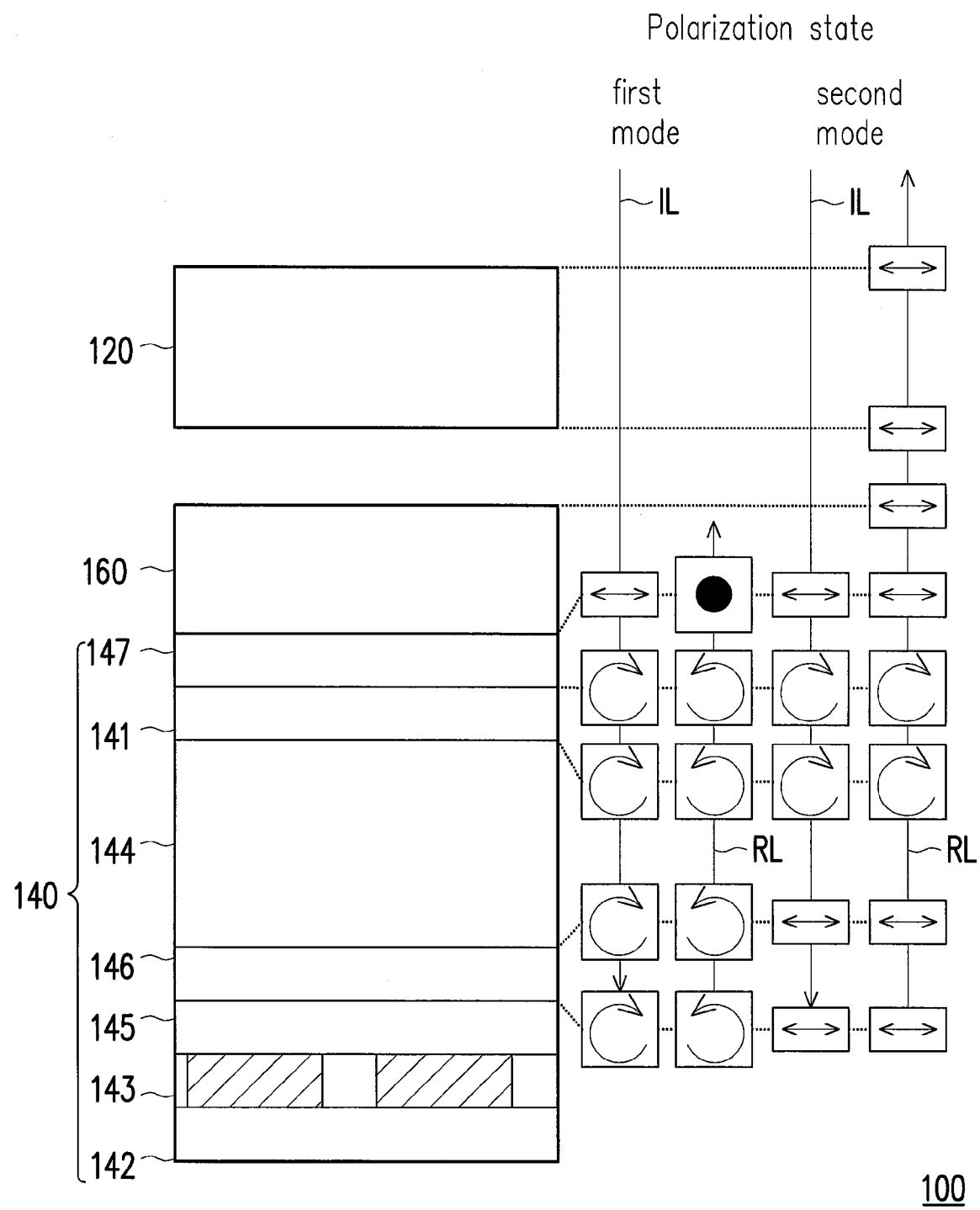
FIG. 3 is a schematic diagram illustrating a display apparatus according to another embodiment of the present disclosure.

FIG. 3 is a schematic diagram illustrating a display apparatus 100 according to another embodiment of the present disclosure. Referring to FIG. 3, the first polarization layer 160 is a linear polarizer. When the display apparatus 100 is operated in the first mode, the unpolarized incident light IL (illustrated in the left part of FIG. 3) transmitting through the first polarization layer 160 is polarized to be the horizontal linear polarized incident light IL. Then, similar to the light path shown in the FIG. 1B, the incident light IL transmitting through the liquid crystal layer 144 without polarization change is reflected by the reflective layer 145 as a reflected light RL, and the reflected light RL is finally blocked or absorbed by the first polarization layer 160.

By contrast, when the display apparatus 100 is operated in the second mode, the polarization state of the incident light IL is changed by the liquid crystal layer 144, so that the incident light IL which reaches to the reflective layer 145 is horizontal linear polarized. Next, the reflected light RL transmitting through the liquid crystal layer 144 is polarized to the right circular polarized reflected light RL. The right circular polarized reflected light RL is allowed to pass through the first polarization layer 160 and polarized to the horizontal linear polarized reflected light RL. The horizontal linear polarized reflected light RL leaves the display apparatus 100 from the transparent light emitting layer 120.

Figure 4:
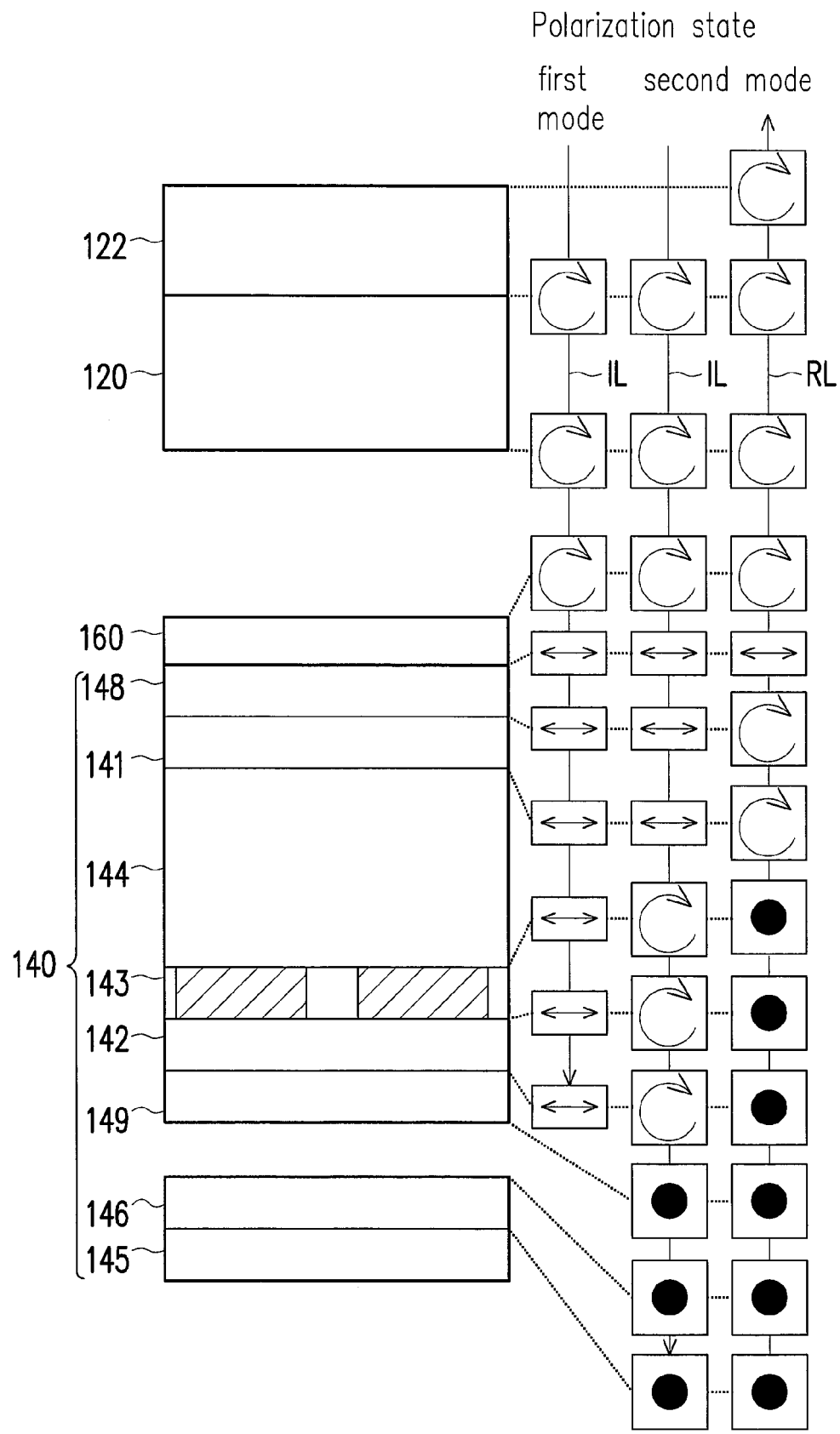
FIG. 4 is a schematic diagram illustrating a display apparatus according to another embodiment of the present disclosure.

FIG. 4 is a schematic diagram illustrating a display apparatus 100 according to another embodiment of the present disclosure. Referring to FIG. 4, the light modification layer 140 in the display apparatus 100 further includes a third linear polarizer 148, a fourth linear polarizer 149 and a color filter layer 146. The third linear polarizer 148 is disposed between the first polarization layer 160 and the first substrate 141, the reflective layer 145 in the embodiment is disposed under the second substrate 142 facing away from the transparent light emitting layer 120 and the fourth linear polarizer 149 is disposed between the second substrate 142 and the reflective layer 145. The third linear polarizer 148 and the fourth linear polarizer 149 are crossed. In other words, the polarization directions of the incident light converted by the third linear polarizer 148 and the fourth linear polarizer 149 are different and orthogonal. Moreover, the color filter layer 146 is disposed between the fourth linear layer 149 and the reflective layer 145. The first polarization layer 160 in this embodiment is a quarter waveplate, and a circular polarizer 122 is disposed at the second side of the transparent light emitting layer 120. A second linear polarizer and a third quarter waveplate (not illustrated in FIG. 4) can be employed instead of the circular polarizer 122 shown in FIG. 4, and the use of the second linear polarizer and the third quarter waveplate is similar to the use of the second linear polarizer 124 and the third quarter waveplate 126 shown in FIG. 2.

According to the light path of the incident light IL transmitting through the display apparatus 100 in the first mode, when the incident light IL transmits through the circular polarizer 122, the incident light IL is polarized to the right circular polarized incident light IL. Next, the right circular polarized incident light IL transmits through the transparent light emitting layer 122 and the first polarization layer 160, and the right circular polarized incident light IL is transferred to be the horizontal linear polarized incident light IL by the first polarization layer 160. Since the liquid crystal layer 144 is induced by the electric field provided by the electrodes 143 with the first voltage to transmit the incident light IL without changing the polarization state of the incident light IL, the horizontal linear polarized incident light IL is possible to transmit through the third linear polarizer 148 and the liquid crystal layer 144 without changing the polarization. However, the fourth linear polarizer 149 and the third linear polarizer 148 are crossed, so the horizontal linear polarized incident light IL will be blocked by the fourth linear polarizer 149. Therefore, the light modification layer 140 is displayed as the black background for the transparent light emitting layer 120.

By contrast, according to the light path of the incident light IL and the reflected light RL transmitting through the display apparatus 100 in the second mode, the incident light IL transmits through the circular polarizer 122, the transparent light emitting layer 122 and the first polarization layer is polarized to be the horizontal linear polarized incident light IL. In the second mode, no voltage is applied to the electrodes 143, and the polarization state of the incident light IL is changed by the liquid crystal layer 144. As the result, the horizontal linear polarized incident light IL transmitting through the liquid crystal layer 144 is changed to be the right circular polarized incident light IL. Further, the right circular polarized incident light IL is capable of transmitting through the fourth linear polarizer 149, and the right circular polarized incident light IL is polarized to the vertical linear polarized incident light IL. The vertical linear polarized incident light IL is then reflected by the reflective layer 145 as the reflected light RL which is also vertical linear polarized. The reflected light RL sequentially transmits through the light modification layer 140, the first polarization layer 160, the transparent light emitting layer 120 and the circular polarizer 122, and leaves the display apparatus 100. Therefore, the printed pattern or the color of the color filter layer 146 can be shown through the display apparatus 100 in the second mode. The change of the polarization of the reflected light RL is shown in FIG. 4, so no detail description is provided herein.

Moreover, the reflective layer 145 in the present embodiment can be designed as the reflective layer 145 shown in the FIG. 1D to have a surface facing to the transparent light emitting layer 120 with bump-shaped. In other embodiments, the color filter layer 146 can be designed as the color filter layer 146 shown in the FIG. 1E to have different portions with different light-absorbing properties.

In the previous embodiments, the liquid crystal layer is employed in the light modification layer and adjusted depending on the operation mode of the display apparatus. The liquid crystal layer plays an important role on switching the display apparatus between first mode and the second mode, but the present disclosure is not limited thereto. However, the liquid crystal layer can be replaced by other specific layers which are also used for light modification. Other suitable technology, such as polymer-dispersed liquid crystal (PDLC) devices, suspended particle devices (SPDs), polymeric solid electrolytes and micro-blinds, can be applied in the light modification layer instead of the liquid crystal layer.

Figure 5:
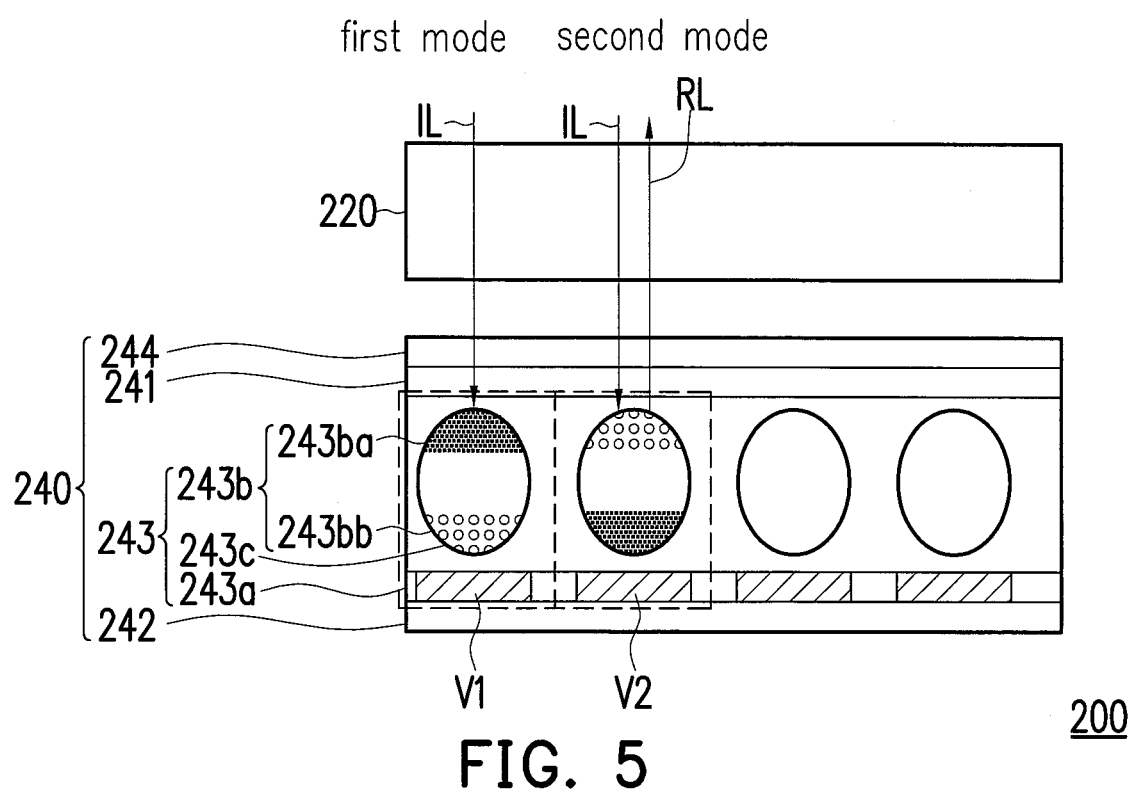
FIG. 5 is a schematic diagram illustrating a display apparatus according to an embodiment of the present disclosure.

FIG. 5 is a schematic diagram illustrating a display apparatus 200 according to an embodiment of the present disclosure. Referring to FIG. 5, the display apparatus 200 switchable between the first mode and the second mode includes a transparent light emitting layer 220 and the light modification layer 240. The transparent light emitting layer 220 is configured to display images in the first mode and be disabled in the second mode. The light modification layer 140 disposed at a first side of the transparent light emitting layer 220 which is under the transparent light emitting layer 200 includes the first substrate 241, the second substrate 242 under and opposed to the first substrate 241 and a plurality of pixel units 243 disposed between the first substrate 241 and the second substrate 242. Each of the pixel units includes an electrode 243a and a color medium 243b.

The pixel units 243 are employed instead of the liquid crystal layer 144 shown in FIG. 1A for switching the display apparatus 200 between the first mode and the second mode. Generally speaking, the structure of the pixel unit 243 can be varied according to the design of the display apparatus 200. In this embodiment shown in FIG. 5, the pixel unit 243 further includes a micro-container 243, and the color medium 243 includes a plurality of first charged color particles 243ba and a plurality of second charged color particles 243bb. The micro-container 234 contains the first charged color particles 243ba and the second charged color particles 243bb. The first charged color particles 243ba absorb the incident light IL transmitting through the transparent light emitting layer 220, and the second charged color particles 243bb reflect the incident light IL transmitting through the transparent light emitting layer 220. The first charged color particles 243ba and the second charged color particles 243bb can be, for example but not limited to, the black color particles and the white color particles.

When the display apparatus 200 is operated in the first mode, the light modification layer 140 is configured to absorb the incident light IL transmitting through the transparent light emitting layer 220 by the color medium 243b. On the other hand, when the display apparatus 200 is operated in the second mode, the light modification layer 140 is configured to reflect the incident light IL so that the incident light IL is reflected as a reflected light RL transmitting through the transparent light emitting layer 220. In the present embodiment, the incident light IL is reflected by the color medium 243b shown in FIG. 5, but the present disclosure is not limited thereto, and the incident light IL is reflected by the reflective layer in other embodiments.

To be more specific, when the display apparatus 200 is operated in the first mode, a first voltage V1 is applied through the electrode 243a in the at least one of the pixel units 243 to generate a first electric field. Since the first color particles 243ba and the second color particles 243bb are charged with different polarities, the first charged color particles 243ba are induced by the first electric field and repelled towards the first substrate 241, and the second charged color particles 243bb are attracted towards the electrode 243a. As the result, the incident light IL is absorbed by the first charged color particles 243ba, and the light modification layer 240 is employed as the solid black background. By contrast, when the display apparatus 200 is operated in the second mode, a second voltage V2 is applied through the electrode 243a in the at least one of the pixel units 243 to generate a second electric field. Therefore, the second charged color particles 243bb are induced by the second electric field and repelled towards the first substrate 241, and the first charged color particles 243ba are attracted towards the electrode 243a. The incident light IL is thus reflected by the second charged color particles 243bb.

Each of the electrodes 243a can be individually controlled, so that the first voltage V1 and the second voltage V2 can be respectively selected and provided to the pixel units 243.

Moreover, the light modification layer 240 further includes a color filter layer 244 disposed between the transparent light emitting layer 220 and the first substrate 241. A printed pattern may be formed on the color filter layer 244, and the printed pattern and the color of the color filter layer 244 can be displayed through the display apparatus 200 when the transparent light emitting layer 220 is disabled in the second mode.

Figure 6:
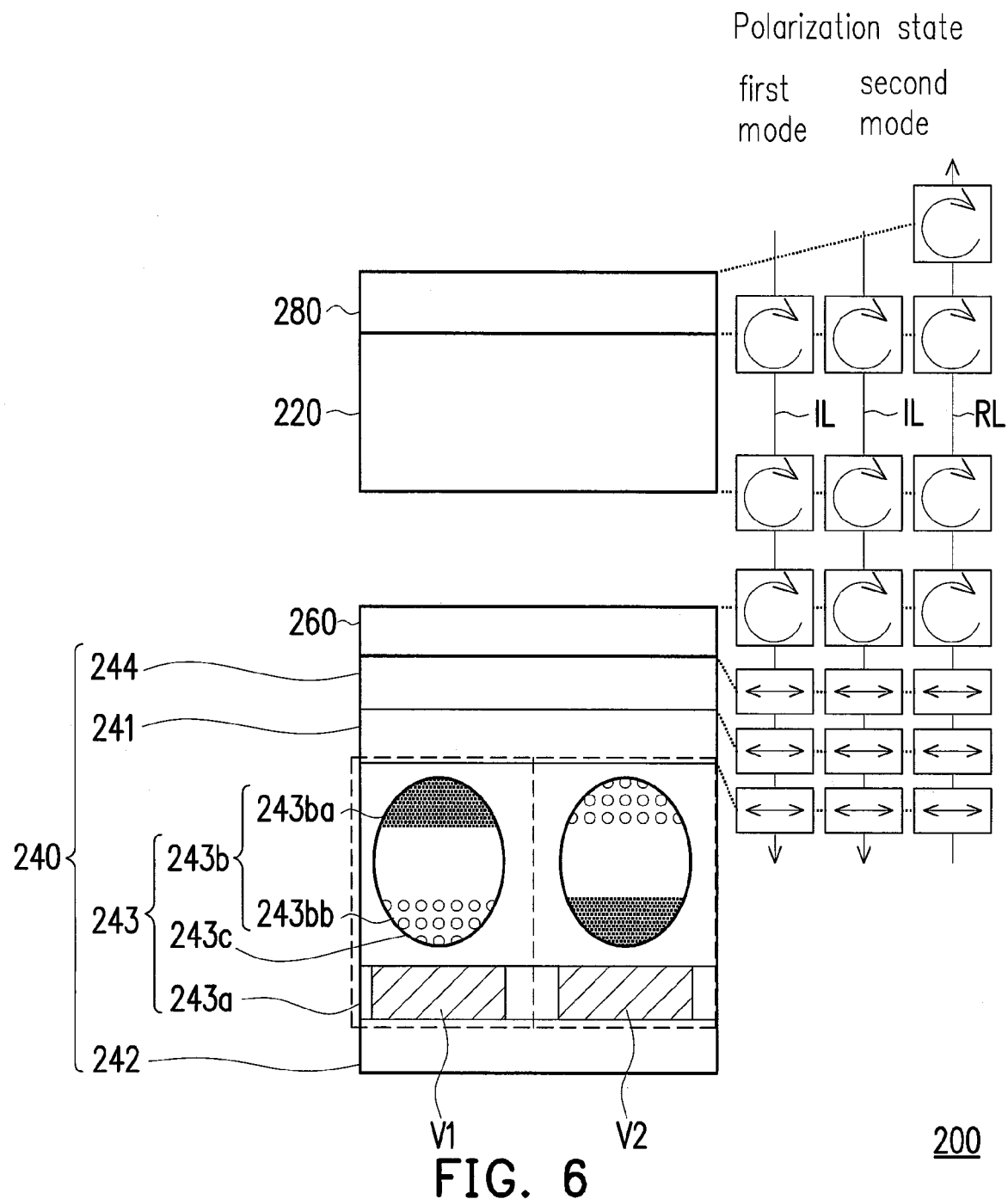
FIG. 6 is a schematic diagram illustrating a display apparatus according to another embodiment of the present disclosure.

FIG. 6 is a schematic diagram illustrating a display apparatus 200 according to an embodiment of the present disclosure. Referring to FIG. 6, the display apparatus 200 further includes a first polarization layer 260 disposed between the light modification layer 240 and the transparent light emitting layer 220 and a second polarization layer 280 disposed at a second side of the transparent light emitting layer 200, where the second side of the transparent light emitting layer 200 is opposite to the first side of the transparent light emitting layer 220. According to the embodiment shown in FIG. 6, the first polarization layer 260 is a quarter waveplate, and the second polarization layer 280 is a circular polarizer.

According to FIG. 6, when the incident light IL transmits through the second polarization layer 280, the incident light IL is polarized to the circular polarized incident light IL. Next, the circular polarized incident light IL transmits through the transparent light emitting layer 220 and the first polarization layer 260 is polarized to the linear polarized incident light IL. The linear polarized incident light IL thus transmits to the light modification layer 240, and the incident light IL may be absorbed or reflected by the light modification layer 240 depending on the operation mode of the display apparatus 200. If the display apparatus 200 is operated in the first mode, the linear polarized incident light IL is absorbed by the first charged color particles 243ba, and the light modification layer 240 can be applied as the black background. On the contrary, if the display apparatus 200 is operated in the second mode, the linear polarized incident light IL is reflected as the reflected light RL by the second charged color particles 243bb. The reflected light RL transmitting through the first polarization layer 260 is polarized to the circular polarized reflected light RL, and the circular polarized reflected light RL is allowed to pass through the second polarization layer 280. Therefore, the printed pattern and color of the color filter layer 244 is displayed through the display apparatus 200 in the second mode.

The second polarization layer 280 can have different structures. In another embodiment, a linear polarizer and a quarter waveplate can be employed instead of the circular polarizer as the second polarization layer 280 shown in FIG. 6. The structure and the use of the combination of the linear polarizer and the quarter waveplate can be inferred form the FIG. 2 and the related description, so they will not be described further.

Figure 7:
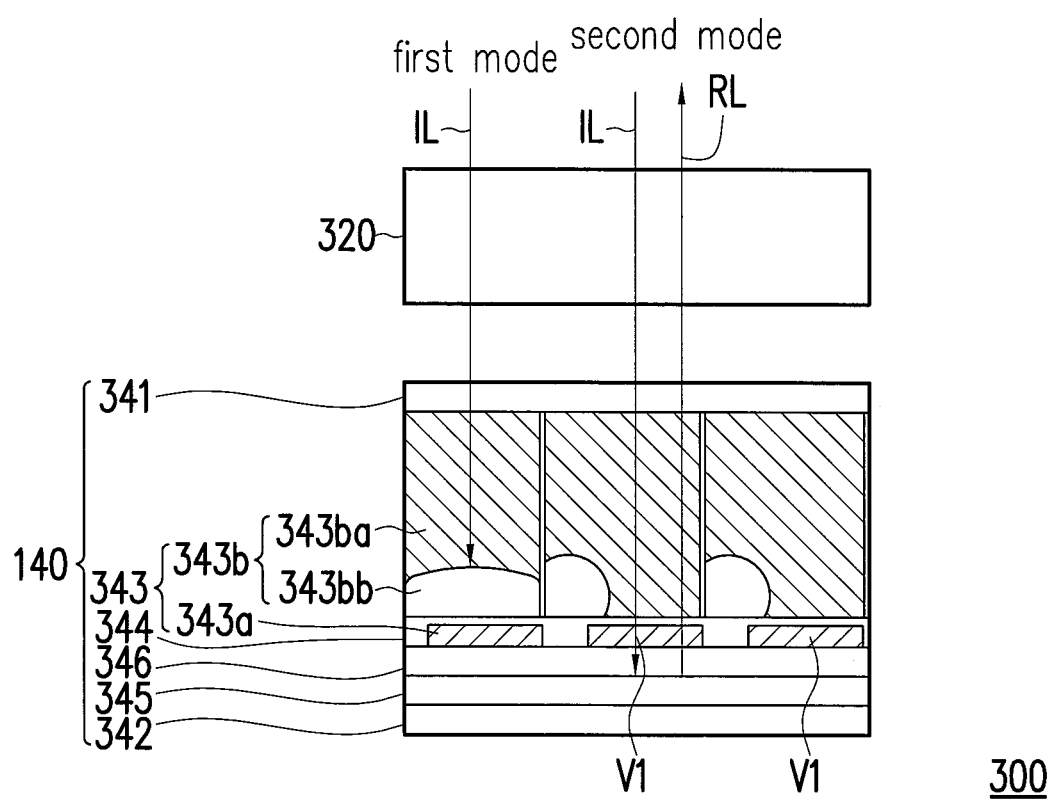
FIG. 7 is a schematic diagram illustrating a display apparatus according to an embodiment of the present disclosure.

FIG. 7 is a schematic diagram illustrating a display apparatus 300 according to an embodiment of the present disclosure. Referring to FIG. 7, the main structure and the operation method of the display apparatus 300 is similar to the main structure and the operation method of the display apparatus 200 shown in FIG. 5. However, the design of the pixel units and the color filter in the display apparatus 300 is different from the design of the pixel units and the color filter in the display apparatus 200. In addition, the light modification layer 340 in the display apparatus 300 further includes a hydrophobic layer 344 and a reflective layer 345.

The hydrophobic layer 344 is disposed on the second substrate 342, and the reflective layer 345 is disposed between the hydrophobic layer 344 and the second substrate 342. The color medium 343b includes a polar first liquid 343ba and a colored and non-polar second liquid 343bb disposed in the pixel unit 343. Each of the pixel units includes the electrode 343a as well, and the pixel unit 343 may be separated from each others by a grid. The first liquid 343ba and the second liquid 343bb are immiscible. Moreover, the light modification layer 340 includes a color filter layer 346, and the color filter layer 346 is disposed between the hydrophobic layer 344 and the reflective layer 345.

When the display apparatus 300 is operated in the first mode, no voltage is applied through the electrode 343a in at least one of the pixel units 343. The electrode 343a is thus covered by the second liquid 343bb due to its non-polar property, and the incident light IL is absorbed by the second liquid 343bb. Therefore, the light modification layer 340 is applied as a colored background. The color of the second liquid 343bb is, for example but not limited to, black. By contrast, when the display apparatus 300 is operated in the second mode, a first voltage V1 is applied through the electrode 343a to modify a wetting property of the second liquid 434bb. The electrode 343a is thus exposed because the second liquid 434bb is repelled by a portion of the hydrophobic layer 344, and the incident light IL transmitting through the first liquid 343ba is reflected by the reflective layer 345. The electrode 343a in the present embodiment is transparent to allow the incident light IL and the reflected light RL to pass through it. As the result, the printed pattern or the color of the color filter can be displayed through the display apparatus 300 in the second mode.

In another embodiment, the display apparatus 300 further includes a first polarization layer and the second polarization layer (not illustrated) similar to the first polarization layer 260 and the second polarization layer 280 shown in FIG. 6. In the display apparatus 300, the first polarization layer can be a quarter waveplate, and the second polarization layer can be a circular polarizer or a combination of the linear polarizer and the quarter waveplate. The structure and the use of the first polarization layer and the second polarization layer can be inferred from the embodiments shown in FIG. 2 and FIG. 6, so they will not be described herein for concise purpose.

Figure 8:
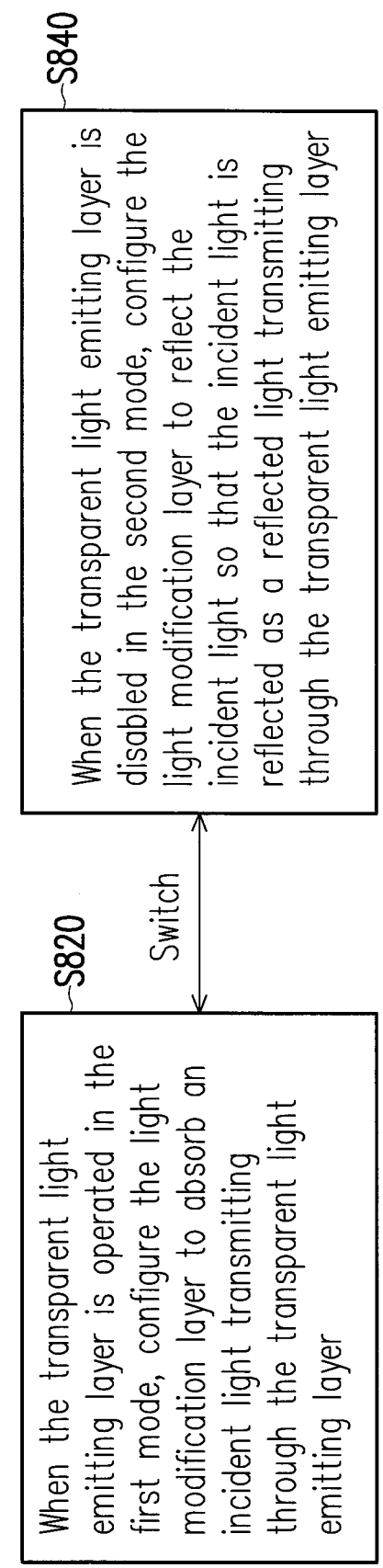
FIG. 8 is a flow diagram illustrating a display method according to an embodiment of the present disclosure.

FIG. 8 is a flow diagram illustrating a display method according to an embodiment of the present disclosure. The display method is adopted by a display apparatus, where the display apparatus includes a transparent light emitting layer and a light modification layer. The light modification layer is disposed under the transparent light emitting layer, and the transparent light emitting layer is configured to display images in a first mode and be disabled in the a second mode. The display method includes the following steps.

In step S820, when the transparent light emitting layer is operated in the first mode, the light modification layer is configured to absorb an incident light transmitting through the light emitting layer. In step S840, when the transparent light emitting layer is disabled in the second mode, the light modification layer is configured to reflect the incident light so that the incident light is reflected as a reflected light transmitting through the transparent light emitting layer. Since the display apparatus is switchable between the first mode and the second mode, the display method adopted by the display apparatus provided in the present embodiment is applied for switching the light modification layer to a suitable state according to the current operation mode of the display apparatus.

As described above, in the display apparatus provided by the embodiment of the disclosure, a light modification layer is employed to absorb or to reflect the incident light transmitting through the transparent light emitting layer. When the transparent light emitting layer is active for display images, the light modification layer is configured to absorb the incident light, so that the light modification layer is operated as a solid background to provide better visual effect. When the transparent light emitting layer is inactive for idle state, the light modification layer is configured to reflect the incident light as a reflected light. Under such condition, the desired background color or pattern of the color filter or the reflective layer disposed in the light modification layer can be displayed through the display apparatus. Additionally, in a display method adopted by the display apparatus, the light modification layer is configured to absorb or to reflect the incident light depending on the operation mode of the display apparatus.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A display apparatus, which is switchable between a first mode and a second mode, comprising:
a transparent light emitting layer configured to display image in the first mode and be disabled in the second mode;
a light modification layer, disposed at a first side of the transparent light emitting layer which is under the transparent light emitting layer and comprising a first substrate, a second substrate under and opposed to the first substrate, a plurality of electrodes disposed on the second substrate, a liquid crystal layer disposed between the first substrate and the second substrate, and a reflective layer disposed under the liquid crystal layer; and
a first polarization layer disposed between the transparent light emitting layer and the light modification layer and configured to polarize an incident light which transmits through the transparent light emitting layer,
wherein the light modification layer further comprises a first quarter waveplate disposed between the first polarization layer and the first substrate, and wherein when the display apparatus is operated in the first mode, the light modification layer is configured to absorb the incident light by the liquid crystal layer; and when the display apparatus is operated in the second mode, the light modification layer is configured to reflect the incident light by the reflective layer so that the incident light is reflected as a reflected light transmitting through the transparent light emitting layer.

2. The display apparatus as claimed in claim 1, wherein the light modification layer further comprises a color filter layer, the reflective layer is disposed on the electrodes and the color filter layer is disposed between the liquid crystal layer and the reflective layer.

3. The display apparatus as claimed in claim 2, wherein the reflective layer having a surface facing to the transparent light emitting layer is bump-shaped.

4. The display apparatus as claimed in claim 2, wherein the color filter layer having a first portion and a second portion, and wherein a first wavelength of the incident light and the reflected light is absorbed by the first portion and the incident light and the reflected light transmitted through the second portion without being absorbed.

5. The display apparatus as claimed in claim 1, wherein when the display apparatus is operated in the first mode, a first voltage is applied though at least one of the electrodes to generated a first electric field and the liquid crystal layer is induced by the first electric field to transmit the incident light through the liquid crystal layer without changing a polarization state of the incident light, and when the display apparatus is operated in the second mode, no voltage is applied though at least one of the electrodes and the polarization state of the incident light is changed by the liquid crystal layer.

6. The display apparatus as claimed in claim 1, wherein the first polarization layer comprises a second quarter waveplate and a first linear polarizer and wherein the first linear polarizer is disposed between the second quarter waveplate and the first substrate.

7. The display apparatus as claimed in claim 1, wherein the transparent light emitting layer further comprises a second linear polarizer disposed at a second side of the transparent light emitting layer and a third quarter waveplate disposed between the second linear polarizer and the transparent light emitting layer and wherein the second side of the transparent light emitting layer is opposite to the first side of the transparent light emitting layer.

8. The display apparatus as claimed in claim 1, wherein the display apparatus further comprises a circular polarizer disposed at a second side of the transparent light emitting layer and wherein the second side of the transparent light emitting layer is opposite to the first side of the transparent light emitting layer.

9. The display apparatus as claimed in claim 1, wherein the light modification layer further comprises a third linear polarizer, a forth linear polarizer and a color filter layer; and wherein the third linear polarizer is disposed between the first polarization layer and the first substrate; the reflective layer is disposed under the second substrate facing away from the transparent light emitting layer; the forth linear polarizer is disposed between the second substrate and the reflective layer; the third linear polarizer and the forth linear polarizer are crossed; and the color filter layer is disposed between the forth linear polarizer and the reflective layer.

10. The display apparatus as claimed in claim 9, wherein the first polarization layer is a quarter waveplate.

11. The display apparatus as claimed in claim 9, wherein the color filter layer having a first portion and a second portion, and wherein a first wavelength of the incident light and the reflected light is absorbed by the first portion and the incident light and the reflected light transmitted through the second portion without being absorbed.

12. The display apparatus as claimed in claim 9, wherein the reflective layer having a surface facing to the transparent light emitting layer is bump-shaped.

13. A display apparatus, which is switchable between a first mode and a second mode comprising:
   a transparent light emitting layer configured to display image in the first mode and be disabled in the second mode; and
   a light modification layer disposed at a first side of the transparent light emitting layer which is under the transparent light emitting layer and comprising a first substrate, a second substrate under and opposed to the first substrate, and a plurality of pixel units disposed between the first substrate and the second substrate, wherein each pixel unit includes an electrode and a color medium,
   wherein when the display apparatus is operated in the first mode, the light modification layer is configured to absorb an incident light, which transmits through the transparent light emitting layer, by the color medium; and when the display apparatus is operated in the second mode, the light modification layer is configured to reflect the incident light so that the incident light is reflected as a reflected light transmitting through the transparent light emitting layer, and
   wherein the pixel unit comprises a micro-container, and the color medium comprises a plurality of first charged color particles and a plurality of second charged color particles and the micro-containers contains the first charged color particles and the second charged color particles and the first charged color particle absorbed the incident light transmitted through the transparent light emitting layer and the second charged color particle reflected the incident light transmitted through the transparent light emitting layer.

14. The display apparatus as claimed in claim 13, wherein when the display apparatus is operated in the first mode, a first voltage is applied though the electrode in at least one of the pixel units to generated a first electric field and the first charged color particles is induced by the first electric field and repelled toward the first substrate and the second charged color particles is attracted toward the electrode, and when the display apparatus is operated in the second mode, a second voltage is applied though the electrode in at least one of the pixel units to generated a second electric field and the second charged color particles is induced by the second electric field and repelled toward the first substrate and the first charged color particles is attracted toward the electrode.

15. The display apparatus as claimed in claim 13, wherein the light modification layer further comprises a color filter layer disposed between the transparent light emitting layer and the first substrate.

16. The display apparatus as claimed in claim 13, wherein the display apparatus further comprises a first polarization layer disposed between the light modification layer and the transparent light emitting layer and a second polarization layer disposed at a second side of the transparent light emitting layer and wherein the second side of the transparent light emitting layer is opposite to the first side of the transparent light emitting layer.

17. The display apparatus as claimed in claim 16, wherein the first polarization layer is a quarter waveplate and the second polarization layer is a circular polarizer.

18. The display apparatus as claimed in claim 16, wherein the first polarization layer is a quarter waveplate and the second polarization layer comprises a linear polarizer and a quarter waveplate disposed between the linear polarizer and the transparent light emitting layer.

19. The display apparatus as claimed in claim 13, wherein the light modification layer further comprises a hydrophobic layer disposed on the second substrate and a reflective layer disposed between the hydrophobic layer and the second substrate, the color medium comprises a polar first liquid and a colored and non-polar second liquid disposed in the pixel unit and the first liquid and the second liquid are immiscible.

20. The display apparatus as claimed in claim 19, wherein when the display apparatus is operated in the first mode, no voltage is applied though the electrode in at least one of the pixel units and the second liquid cover the electrode and absorbed the incident light, and when the display apparatus is operated in the second mode, a first voltage is applied though the electrode in at least one of the pixel units to generated a first electric field to modify a wetting property of the second liquid and the incident light is transmitted through the first liquid and reflected by the reflective layer.

21. The display apparatus as claimed in claim 19, wherein the light modification layer further comprises a color filter layer disposed between the hydrophobic layer and the reflective layer.

* * * * *